United States Patent
Kim

(10) Patent No.: US 10,038,010 B2
(45) Date of Patent: Jul. 31, 2018

(54) SEMICONDUCTOR DEVICE

(71) Applicant: SAMSUNG ELECTRONICS CO., LTD., Suwon-si (KR)

(72) Inventor: Yong-hoon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/593,965

(22) Filed: May 12, 2017

(65) Prior Publication Data
US 2018/0158830 A1    Jun. 7, 2018

(30) Foreign Application Priority Data

Dec. 6, 2016 (KR) .......................... 10-2016-0165172

(51) Int. Cl.
*H01L 27/118* (2006.01)
*H01L 27/11* (2006.01)
(Continued)

(52) U.S. Cl.
CPC ........ *H01L 27/118* (2013.01); *H01L 27/1104* (2013.01); *H01L 27/1116* (2013.01);
(Continued)

(58) Field of Classification Search
CPC ............. G06F 17/5068; G06F 17/5072; H01L 27/10894; H01L 27/1116; H01L 27/11286;
(Continued)

(56) References Cited

U.S. PATENT DOCUMENTS 5,468,983 A * 11/1995 Hirase .................. H01L 27/105
257/344
5,831,315 A    11/1998 Kengeri et al.
(Continued)

FOREIGN PATENT DOCUMENTS

JP         2008-21675 A   1/2008
KR    10-2015-0058598 A   5/2015

OTHER PUBLICATIONS

Siegelin et al., "Dislocation related Leakage in Advanced CMOS devices", Proceedings of the 31st International Symposium for Testing and Failure Analysis, Nov. 6-10, 2005, 6 pages total, ASM International, San Jose, California, USA.

*Primary Examiner* — Eduardo A Rodela
(74) *Attorney, Agent, or Firm* — Sughrue Mion, PLLC

(57) ABSTRACT

A semiconductor device may include: a substrate; a first well region formed on the substrate; a second well region formed on the substrate, the first well region and the second well region extending in a first direction and being adjacent to each other in a second direction crossing the first direction; a first active region formed in the first well region; a first power region formed in the first well region, the first active region and the first power region being separate from each other in the first direction; a second active region array formed in the second well region; a second power region formed in the second well region, the second active region array and the second power region being separate from each other in the first direction; and a first dummy active region formed in the first well region between the first active region and the first power region, the first dummy active region being separate from the first active region and the first power region in the first direction.

14 Claims, 13 Drawing Sheets

(51) Int. Cl.
*H01L 27/11575* (2017.01)
*H01L 27/11548* (2017.01)
*H01L 27/112* (2006.01)
*H01L 27/11573* (2017.01)

(52) U.S. Cl.
CPC .. *H01L 27/11286* (2013.01); *H01L 27/11548* (2013.01); *H01L 27/11573* (2013.01); *H01L 27/11575* (2013.01)

(58) Field of Classification Search
CPC ......... H01L 27/11509; H01L 27/11512; H01L 27/11548; H01L 27/11573; H01L 27/11575; H01L 27/11592; H01L 27/11595; H01L 27/118; H01L 27/11829
See application file for complete search history.

(56) References Cited

U.S. PATENT DOCUMENTS

| | | | |
|---|---|---|---|
| 5,946,230 A * | 8/1999 | Shimizu | H01L 27/105 257/314 |
| 6,569,723 B2 | 5/2003 | Liaw | |
| 6,920,079 B2 | 7/2005 | Shibayama | |
| 7,582,494 B2 | 9/2009 | Chung et al. | |
| 7,675,124 B2 | 3/2010 | Liaw | |
| 8,258,040 B2 * | 9/2012 | Ito | H01L 27/0207 257/E21.396 |
| 8,589,847 B2 * | 11/2013 | Law | G06F 17/5054 716/100 |
| 8,908,421 B2 | 12/2014 | Liaw | |
| 8,921,179 B2 | 12/2014 | Paul et al. | |
| 8,921,915 B2 * | 12/2014 | Park | H01L 29/7881 257/314 |
| 9,024,409 B2 * | 5/2015 | Jung | H01L 27/10873 257/508 |
| 9,209,195 B2 | 12/2015 | Seshadri et al. | |
| 2011/0024833 A1 * | 2/2011 | Jang | H01L 27/10876 257/334 |
| 2012/0120703 A1 | 5/2012 | Chang et al. | |
| 2013/0240971 A1 * | 9/2013 | Takekida | H01L 27/0738 257/316 |
| 2014/0177312 A1 * | 6/2014 | Shibata | H01L 27/0207 365/72 |
| 2015/0137252 A1 | 5/2015 | Baek et al. | |
| 2016/0064339 A1 * | 3/2016 | Fornara | H01L 21/768 257/211 |

* cited by examiner

SEMICONDUCTOR DEVICE

CROSS-REFERENCE TO RELATED APPLICATION

This application claims priority from Korean Patent Application No. 10-2016-0165172, filed on Dec. 6, 2016 in the Korean Intellectual Property Office, the disclosure of which is incorporated herein in its entirety by reference.

BACKGROUND

Devices consistent with example embodiments relate to a semiconductor device, and more particularly, to a semiconductor device including static random access memory (SRAM).

As a semiconductor device becomes smaller and more highly integrated, a semiconductor device may include a plurality of integrated circuits (ICs) operating at different voltage ranges from each other. For example, a mobile display driving IC may include a source driving IC operating at a high voltage range, a gate driving IC operating at an intermediate voltage range, a graphics memory IC operating at a low voltage range, and a logic IC. In this case, a long high-temperature process may be required to form, for example, a well region including a high pressure element. Such a long process at a high temperature may adversely affect all circuits of the semiconductor device.

SUMMARY

One or more exemplary embodiments may provide a semiconductor device with improved reliability and/or improved manufacturing yield.

According to an aspect of an example embodiment, there is provided a semiconductor device including: a substrate; a first well region formed on the substrate; a second well region formed on the substrate, the first well region and the second well region extending in a first direction and being adjacent to each other in a second direction crossing the first direction; a first active region formed in the first well region; a first power region formed in the first well region, the first active region and the first power region being separate from each other in the first direction; a second active region array formed in the second well region; a second power region formed in the second well region, the second active region array and the second power region being separate from each other in the first direction; and a first dummy active region formed in the first well region between the first active region and the first power region, the first dummy active region being separate from the first active region and the first power region in the first direction.

According to an aspect of another example embodiment, there is provided a semiconductor device including: a substrate; a first well region formed on the substrate; a second well region formed on the substrate, the first well region and the second well region extending in a first direction and being adjacent to each other in a second direction crossing the first direction; a first active region formed in the first well region; a first power region formed in the first well region, the first active region and the first power region being separate from each other in the first direction; a second active region array formed in the second well region; a second power region formed in the second well region, the second active region array and the second power region being separate from each other in the first direction; and a second dummy active region formed between the second active region array and the second power region in the second well region, the second dummy active region being separate from the second active region array and the second power region in the first direction, wherein the second active region array comprises a plurality of second active regions which are separate from and aligned with each other in the first direction.

According to an aspect of another example embodiment, there is provided a semiconductor device including: a substrate; well regions provided on the substrate; a first active region provided in a first well region among the well regions; a first power region provided in the first well region, the first active region and the first power region being spaced apart from each other; and a first dummy active region provided in the first well region between the first active region and the first power region, the first dummy active region being spaced apart from the first active region and the first power region.

BRIEF DESCRIPTION OF THE DRAWINGS

The above and/or other aspects will be more clearly understood from the following detailed description of example embodiments taken in conjunction with the accompanying drawings in which.

DETAILED DESCRIPTION OF EXAMPLE EMBODIMENTS

Figure 1:
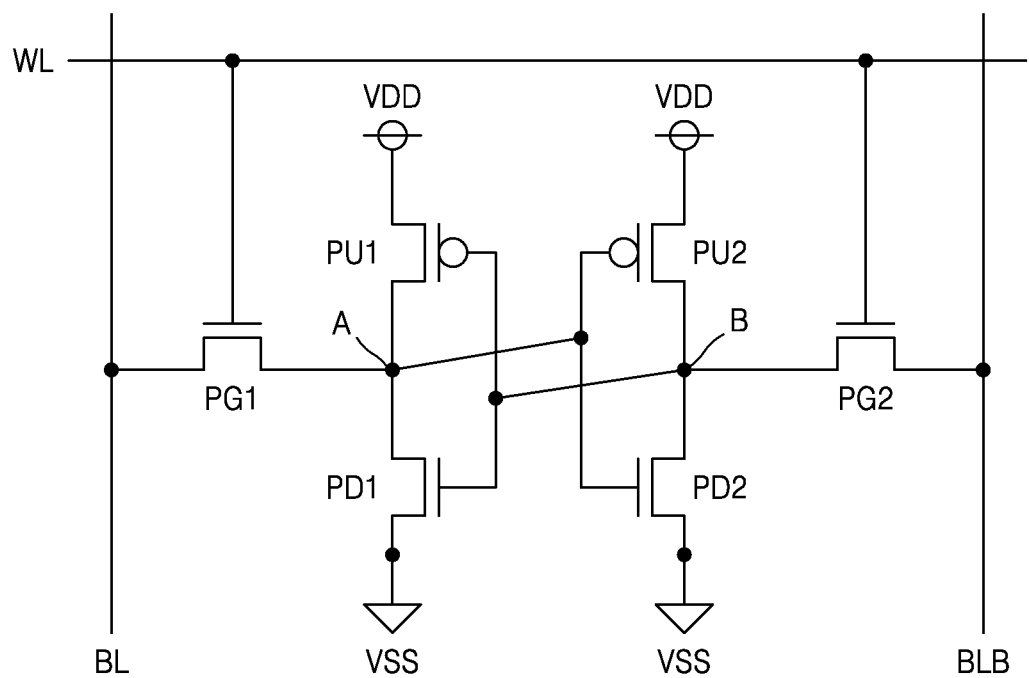
FIG. 1 is a circuit diagram of a unit memory cell included in a semiconductor device according to an example embodiment.

FIG. 1 is an equivalent circuit diagram of a unit memory cell included in a semiconductor device according to an example embodiment.

Referring to FIG. 1, the unit memory cell may include a pair of bit lines BL and BLB, a word line WL, and a plurality of transistors. The unit memory cell may include six transistors, e.g., a first pass transistor PG1 and a second pass transistor PG2, a first pull-up transistor PU1 and a second pull-up transistor PU2, and a first pull-down transistor PD1 and a second pull-down transistor PD2.

The first and second pull-up transistors PU1 and PU2 may be p-channel metal-oxide-semiconductor field effect transistors (PMOSs). The first and second pass transistors PG1 and PG2 and the first and second pull-down transistors PD1 and PD2 may be n-channel metal-oxide-semiconductor field effect transistors (NMOSs). The unit memory cell may include four NMOSs and two PMOSs.

The first and second transistors PG1 and PG2 may have gates connected to the word line WL and drains connected to the bit lines BL and BLB. Sources of the first and second pull-up transistors PU1 and PU2 may be connected to a first power line VDD. Sources of the first and second pull-down transistors PD1 and PD2 may be connected to a second power line VSS. According to an example embodiment, the first power line VDD may supply a power voltage and the second power line VSS may supply a ground voltage. However, embodiments are not limited thereto.

A source of the first pass transistor PG1, a drain of the first pull-up transistor PU1, and a drain of the first pull-down transistor PD1 may be commonly connected to a first contact node A. A source of the second pass transistor PG2, a drain of the second pull-up transistor PU2, and a drain of the second pull-down transistor PD2 may be commonly connected to a second contact node B. Gates of the first pull-up transistor PU1 and the first pull-down transistor PD1 may be commonly connected to the second contact node B and gates of the second pull-up transistor PU2 and the second pull-down transistor PD2 may be commonly connected to the first contact node A. Accordingly, a latch circuit including a pair of complementary metal-oxide-semiconductor (CMOS) inverters may be formed.

When the first contact node A is at a high level, the second pull-up transistor PU2 may be turned off, the second pull-down transistor PD2 may be turned on, and the second contact node B may be at a low level. As the second contact node B transitions to the low level, the first pull-up transistor PU1 may be turned on, the second pull-down transistor PD2 may be turned off, and the first contact node A may maintain the high level.

When the second contact node B is at the high level, the first pull-up transistor PU1 may be turned off, the first pull-down transistor PD1 may be turned on, and the first contact node A may be at the low level. As the first contact node A transitions to the low level, the second pull-up transistor PU2 may be turned on, the second pull-down transistor PD2 may be turned off, and the second contact node B may maintain the high level.

Accordingly, when the first and second pass transistors PG1 and PG2 are turned off based on a gate driving signals applied to the word line WL, data signals supplied to the bit lines BL and BLB may be latched at the first and second contact nodes A and B via the first and second pass transistors PG1 and PG2.

When the first and second pass transistors PG1 and PG2 are turned on, data latched at the first and second contact nodes A and B may be provided to the bit lines BL and BLB via the first and second pass transistors PG1 and PG2, respectively. The data latched at the first and second contact nodes A and B may be respectively read by detecting signals supplied to the bit lines BL and BLB via a detection amplifier.

Figure 2A:
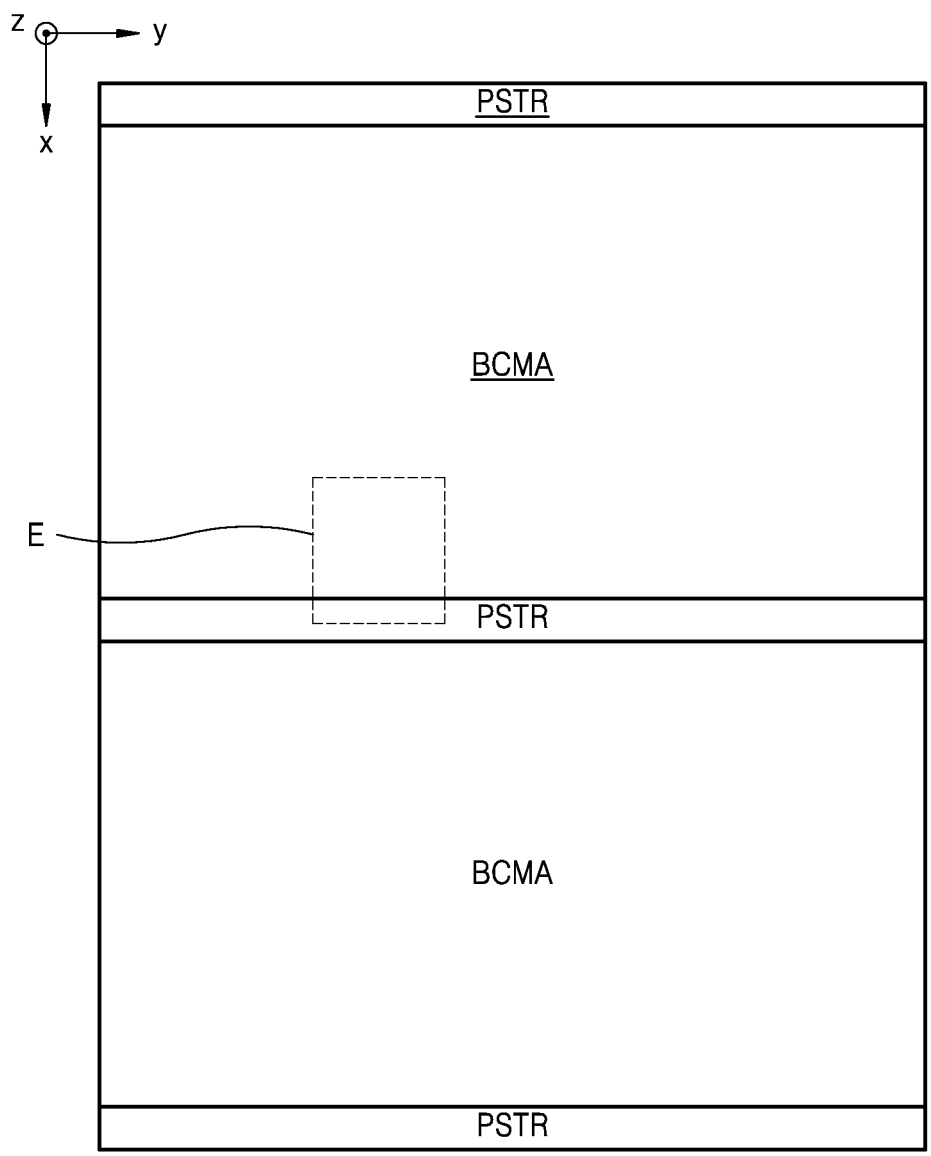
FIG. 2A is a layout diagram of a semiconductor device according to an example embodiment.
Figure 2B:
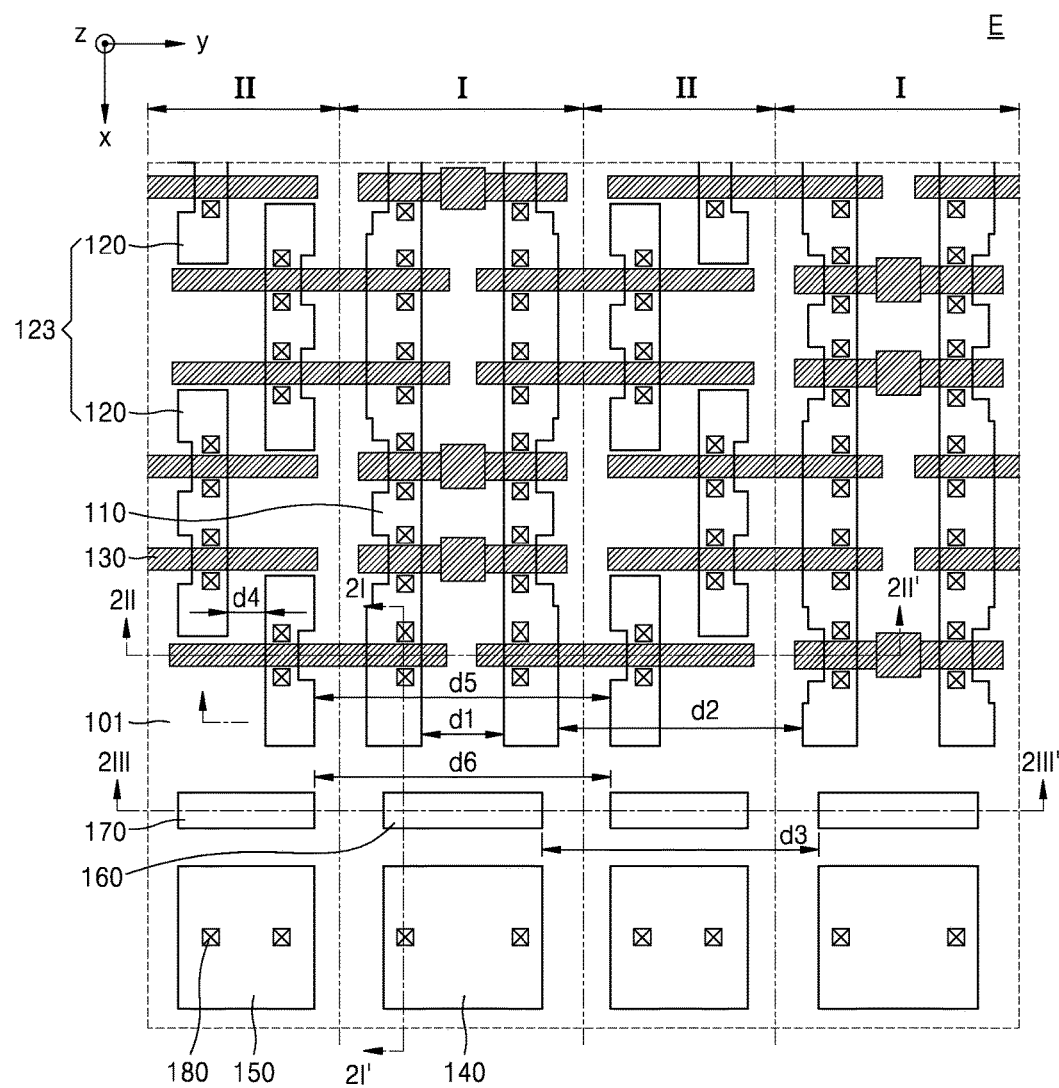
FIG. 2B is an enlarged layout diagram of a portion in FIG. 2A.
Figure 2C:
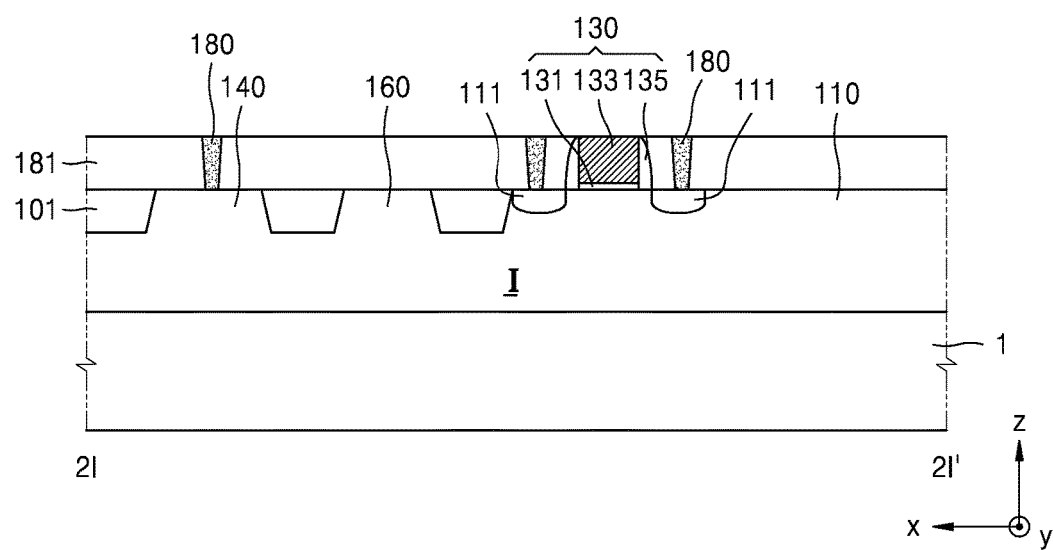
FIGS. 2C, 2D, and 2E are cross-sectional views of the portion, cut along the lines 2I-2I', 2II-2II', and 2III-2III' in FIG. 2B, respectively.
Figure 2D:
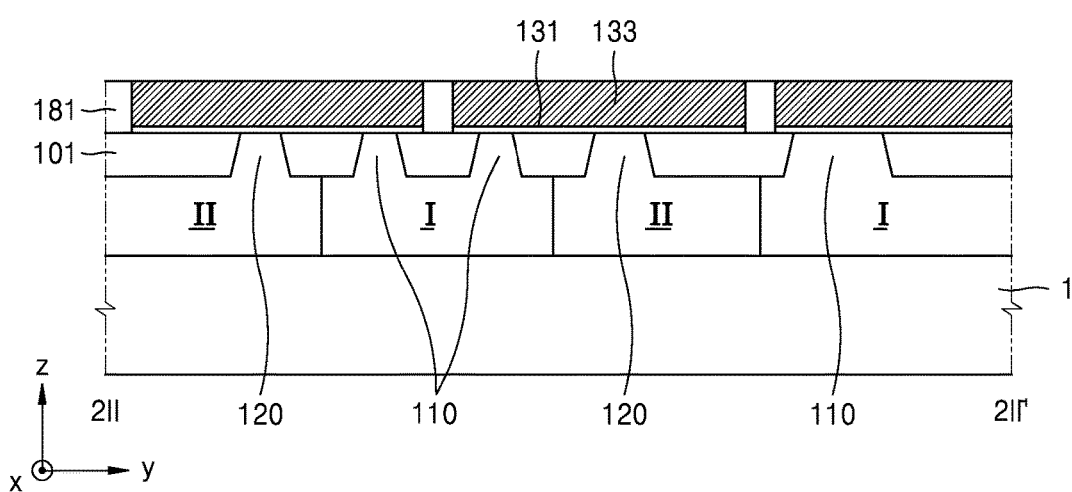
Figure 2E:
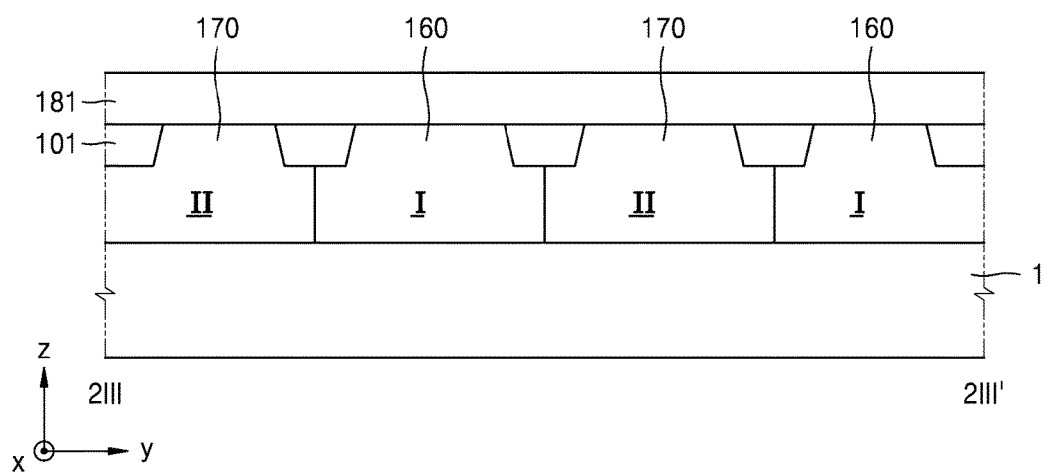

FIG. 2A is a layout diagram of a semiconductor device 10 according to an example embodiment. FIG. 2B is an enlarged layout diagram of a region E in FIG. 2A. FIGS. 2C, 2D, and 2E are cross-sectional views of the region E, cut along the lines 2I-2I', 2II-2II', and 2III-2III' in FIG. 2B, respectively.

Referring to FIGS. 2A through 2E, the semiconductor device 10 may include a portion of a substrate 1, and a plurality of bit cell matrices (BCMAs) and a plurality of power straps (PSTRs), which are adjacent to each other on a top side surface of the substrate 1.

Two directions being parallel to the top side surface of the substrate 1 and crossing each other may be respectively defined as a first direction (an x direction) and a second direction (a y direction), and a direction substantially perpendicular to the top side surface of the substrate 1 may be defined as a third direction (a z direction). For example, the first direction (the x direction) and the second direction (the y direction) may substantially perpendicularly intersect with each other. The second direction (the y direction) and the third direction (the z direction) may substantially be directions perpendicular to the first direction (the x direction). A direction indicated by an arrow and a direction opposite thereto in the drawing will be described as the same direction. A definition of aforementioned directions will be applied to all drawings below.

The unit memory cells described with reference to FIG. 1 may be arranged in rows and columns to form BCMAs. Each BCMA may extend in the first direction (the x direction) and the second direction (the y direction).

According to an example embodiment, each PSTR may include a portion for supplying power to the BCMA, and an element which maintains voltages of a first well region I and a second well region II described below at a certain voltage for driving the BCMA. The portion of the PSTR may constitute the first power line VDD or the second power line VSS in FIG. 1.

The BCMAs may be separate (spaced apart) from each other in the first direction (the x direction). A PSTR may be provided between neighboring BCMAs. The PSTRs may be separate from each other in the first direction (the x direction). A BCMA may be provided between neighboring PSTRs. The BCMAs and the PSTRs may be alternately arranged in the first direction (the x direction).

According to an example embodiment, PSTRs may be formed on opposite ends of the semiconductor device 10 in the first direction (the x direction). According to another example embodiment, BCMAs may be formed on opposite ends of the semiconductor device 10 in the first direction (the x direction). According to another example embodiment, one PSTR may be formed on one end of the semiconductor device 10 in the first direction (the x direction) and one BCMA may be formed on the other end of the semiconductor device 10 in the first direction (the x direction). Since there is a voltage drop due to internal resistance in the first and second well regions I and II, a voltage in the first and second well regions I and II throughout the substrate 1 may be maintained constant by periodically forming the PSTRs between the BCMAs. The periodically forming the PSTRs may denote that the PSTRs are formed each time the unit memory cells on a certain column or a certain row are repeated so that the BCMAs and the PSTRs are alternately arranged.

The substrate 1 may include semiconductor materials such as silicon, germanium, and silicon-germanium, and III-V group compounds such as gallium phosphide (GaP), gallium arsenide (GaAs), and gallium antimonide (GaSb). According to an example embodiment, the substrate 1 may be a silicon-on-insulator (SOI) substrate or a germanium-on-insulator (GOI) substrate.

The substrate 1 may include the first and second well regions I and II. The first and second well regions I and II may be formed on a top side portion of the substrate 1. Since a bottom side portion of the substrate 1 is separate from the top side portion of the substrate 1, the bottom side portion of the substrate 1 may not be injected with impurity for forming the first and second well regions I and II.

According to an example embodiment, the first and second well regions I and II may be of different conductivity types. According to another example embodiment, the first well region I may be a p-well region and the second well region II may be an n-well region. The first well region I may include NMOS transistors and the second well region II may include PMOS transistors. However, embodiments are not limited thereto. The first well region I may be the n-well region and the second well region II may be the p-well region. In this case, the first well region I may include PMOS transistors and the second well region II may include NMOS transistors.

The first and second well regions I and II may extend in the first direction (the x direction). The first well regions I may be separate from each other and arranged in the second direction (the y direction). The second well regions II may be between neighboring first well regions I. The second well regions II may be separate from each other and arranged in the second direction (the y direction). The second well regions II may be between neighboring first well regions I. The first and second well regions I and II may be alternately arranged in the second direction (the y direction).

An element separating layer 101 may be formed in portions of the first and second well regions I and II. The element separating layer 101 may define first active regions 110 and second active regions 120, first power regions 140 and second powers region 150, and first dummy active regions 160 and second dummy active regions 170. The portions covered by the element separating layer 101 on top side surfaces of the first and second well regions I and II may correspond to a field region. Regions, which are exposed due to being uncovered by the element separating layer 101 on top side surfaces of the first and second well regions I and II, may be defined as the first and second active regions 110 and 120, the first and second power regions 140 and 150, and the first and second dummy active regions 160 and 170. Thus, the first active regions 110, the first power regions 140, and the first dummy active regions 160 may be of the same conductivity type. The second active regions 120, the second power regions 150, and the second dummy active regions 170 may be of the same conductivity type. The first active regions 110, the first power regions 140, and the first dummy active regions 160 may of a different conductivity type from the second active regions 120, the second power regions 150, and the second dummy active regions 170. According to an example embodiment, the element separating layer 101 may correspond to a shallow trench isolation (STI). The element separating layer 101 may include, for example, oxides such as silicon oxide.

Portions on the top side surfaces of the first and second well regions I and II may respectively form the first and second active regions 110 and 120. The first and second active regions 110 and 120 may form a portion of the BCMA. Top side surfaces of the first and second active regions 110 and 120 may be formed on substantially the same level as a top side surface of the element separating layer 101.

The first active regions 110 may have a linear shape extending in the first direction (the x direction). The first active regions 110 may a substantially rectangular shape which includes a long side in the first direction (the x direction). A length of each first active region 110 in the first direction (the x direction) may be substantially the same as a length of each BCMA in the first direction (the x direction). However, embodiments are not limited thereto. The first active regions 110 may extend on an entire area of each BCMA (refer to FIG. 2A). The first active regions 110 included in different BCMAs (refer to FIG. 2A) may be arranged in the first direction (the x direction) and separate from each other. Two of the first active regions 110 may be separate from each other in the second direction (the y direction) in one of the first well region I. However, embodiments are not limited thereto. The length of each first active region 110 in the first direction (the x direction) may be longer than the length of each first active region 110 in the second direction (the y direction).

The second active regions 120 may have a linear shape extending in the first direction (the x direction). The second active regions 120 may have a substantially rectangular shape which includes a long side in the first direction (the x direction). A length of each second active region 120 in the first direction (the x direction) may be shorter than a length of the BCMA in the first direction (the x direction). A plurality of second active regions 120 may be separate from and aligned with each other in the first direction (the x direction) in each of the second well regions II. Second active regions 120 which are separate from and aligned with each other in the first direction (the x direction) in one of the second well region II may form a second active region array 123. Two second active region arrays 123 separate from each other in the second direction (the y direction) may be formed in one of the second well region II. However, embodiments are not limited thereto. The length of each second active region 120 in the first direction (the x direction) may be longer than the length of each second active region 120 in the second direction (the y direction).

The length of each first active region 110 in the first direction (the x direction) may be longer than a length of each second active region 120 in the first direction (the x direction). Lengths of the second active region array 123 and the first active regions 110 in the first direction (the x direction) may be substantially the same.

The first power regions 140 may be formed close to an ending edge of the first active regions 110 in the first direction (the x direction). The first power regions 140 may be separate from the first active regions 110 in the first direction (the x direction) on the top side surface of the first well region I. Referring to FIG. 2B, one first power region 140 is illustrated to correspond to two first active regions 110. However, embodiments are not limited thereto. The first active regions 110 and the first power regions 140 may be alternately arranged in the first direction (the x direction).

The second power regions 150 may be formed close to an ending edge of the second active region arrays 123 in the first direction (the x direction). The second power regions 150 may be separate from the second active region arrays 123 in the first direction (the x direction) on the top side surface of the second well region II. Referring to FIG. 2B, one second power regions 150 is illustrated to correspond to two second active region arrays 123. However, embodiments are not limited thereto. The second active region arrays 123 and the second power regions 150 may be alternately arranged in the first direction (the x direction).

The first power regions 140 may be separate from and aligned with each other in the second direction (the y direction). One second power region 150 may be provided between two neighboring first power regions 140. The second power regions 150 may be separate from and aligned with each other in the second direction (the y direction). One first power region 140 may be provided between two neighboring second power regions 150. The first and second power regions 140 and 150 may be alternately arranged in the second direction (the y direction). The first and second power regions 140 and 150 are illustrated to have rectangular shapes on a top view. However, embodiments are not limited thereto. The first and second power regions 140 and 150 may be included in the PSTR. According to an example embodiment, a voltage of the first well region I may be fixed at a ground voltage via the first power region 140 and a voltage of the second well region II may be fixed at a power voltage via the second power region 150. However, embodiments are not limited thereto.

The first dummy active regions 160 may be provided between the first active regions 110 and the first power regions 140. The first dummy active regions 160 may be separate from the first active regions 110 in the first direction (the x direction) on the top side surface of the first well regions I. The first dummy active regions 160 may be separate from the first power regions 140 in the first direction (the x direction). The first dummy active regions 160 may be separate from and aligned with each other in the second direction (the y direction). One second dummy active region 170 may be provided between neighboring first dummy active regions 160. The first dummy active regions 160 and the second dummy active regions 170 may be alternately arranged in the second direction (the y direction).

The second dummy active regions 170 may be between the second active region arrays 123 and the second power regions 150. The second dummy active regions 170 may be separate from the second active regions 120 in the first direction (the x direction) on the top side surface of the second well regions II. The second dummy active regions 170 may be separate from the second power regions 150 in the first direction (the x direction). The first dummy active regions 160 may be provided between neighboring second dummy active regions 170.

The first and second dummy active regions 160 and 170 may extend in the second direction (the y direction). Lengths of the first and second dummy active regions 160 and 170 in the second direction (the y direction) may be longer than lengths of the first and second dummy active regions 160 and 170, respectively, in the first direction (the x direction). The first and second dummy active regions 160 and 170 may be alternately arranged in the second direction (the y direction). The first and second dummy active regions 160 and 170 may have linear shapes in the second direction (the y direction). Alternatively, the first and second dummy active regions 160 and 170 may have substantially rectangular shapes which include long sides in the second direction (the y direction).

Lengths of the first dummy active regions 160 in the second direction (the y direction) may be greater than lengths of the first active region 110 in the second direction (the y direction). Lengths of the second dummy active regions 170 in the second direction (the y direction) may be greater than lengths of the second active regions 120 in the second direction (the y direction). Lengths of the second active regions 120 in the first direction (the x direction) may be greater than lengths of the second dummy active regions 120 in the second direction (the y direction).

According to an example embodiment, two of the first active regions 110 may correspond to one of the first dummy active regions 160. A distance between adjacent first active regions 110 in the second direction (the y direction) in one of the first well region I may be defined as a first distance d1. A distance between the first active regions 110, which are adjacent to and separate from each other with the second well region II therebetween, may be defined as a second distance d2. A distance between adjacent first dummy active regions 160 in the second direction (the y direction) may be defined as a third distance d3. The first distance d1 may be less than those of the second and third distances d2 and d3. An average of distances between adjacent first active regions 110 in the second direction (the y direction) may be less than an average of distances between adjacent first dummy active regions 160 in the second direction (the y direction). In other words, an average of the first distances d1 and the second distances d2 may be less than an average of the third distances d3. In this case, a distance in the second direction (the y direction) may denote a distance between two closest points of two elements separate from each other in the second direction (the y direction).

A distance between adjacent second active region arrays 123 included in one of the second well regions II may be denoted as a fourth distance d4. A distance between second active region arrays 123 which are adjacent to and separate from each other with the first well region I therebetween may be defined as a fifth distance d5. A distance between adjacent second dummy active regions 170 in the second direction (the y direction) may be defined as a sixth distance d6. The fourth distance d4 may be less than those of the fifth and sixth distances d5 and d6. An average of distances between adjacent second active regions 120 in the second direction (the y direction) may be less than an average of distances between adjacent second dummy active regions 170 in the second direction (the y direction). In other words, an average of the fourth distance d4 and the fifth distance d5 may be less than the sixth distance d6.

A sum of lengths of the element separating layers 101 between the first power regions 140 closest to the first active regions 110 in the first direction (the x direction) may be less than a distance between the first power regions 140 closest to the first active region 110 in the first direction (the x direction). A volume of space defined by the first power region 140 closest to the first active region 110 may larger than that of the element separating layer 101 between the first power regions 140 closest to the first active region 110.

As semiconductor devices become highly integrated, semiconductors may be exposed to a high temperature manufacturing process for a long time. When bulk silicon oxide is arranged close to an active region having a linear shape, stress may be applied to an active region having a linear shape during the high temperature manufacturing process. Defects such as dislocation may occur in the active region in subsequent processes such as an ion sputtering process. Defects may be concentrated at an ending edge of the active region having the linear shape and being adjacent to the bulk silicon oxide in an extending direction. Faults such as a source-drain punch through may occur due to such defects.

The present inventive concept may reduce a volume of silicon oxide arranged close to the active region having the linear shape by forming a dummy active region. As the volume of silicon oxide is reduced, stress applied to the active region in the high temperature manufacturing process may be reduced. Accordingly, defects may be prevented in semiconductor devices, and reliability and yield of semiconductor devices may be improved.

A gate structure 130 may substantially extend in the second direction (the y direction). The gate structure 130 may be a gate terminal illustrated in FIG. 1. The gate structure 130 may include a gate insulating layer 131, a gate electrode 133, and a gate spacer 135. Depending on the case, the gate structure 130 may further include a capping layer on the gate electrode 133. A portion of the gate structure 130 may be electrically connected to the word line WL. Elements of the gate structure 130 forming a pass transistor may be electrically connected to the word line WL.

The gate electrode 133 may be formed on the substrate 1. The gate electrode 133 may be on the first and second active regions 110 and 120, and the element separating layer 101. The gate electrode 133 may extend in the second direction (the y direction) and cross the first and second active regions 110 and 120, on a top view. The gate electrode 133 may be separate from the first and second dummy active regions 160 and 170 in a horizontal direction. In a top view, the gate electrode 133 may not cross the first and second dummy active regions 160 and 170. The gate electrode 133 may include a single layer of polysilicon or a laminated film of a polysilicon layer and a metal layer and/or a metal silicide layer.

The gate insulating layer 131 may be provided between the gate electrode 133, and the first and second active regions 110 and 120. In addition, the gate insulating layer 131 may be provided between the gate electrode 133 and the element separating layer 101.

The gate insulating layer 131 may include a material having a large dielectric constant. Materials having a large dielectric constant may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide), lead scandium tantalum oxide, and lead zinc niobate. However, embodiments are not limited thereto. In this case, a large dielectric constant of the material having a large dielectric constant may be greater than those of silicon oxide and silicon nitride, for example, 10 or more.

The gate spacer 135 may be on a side wall of the gate electrode 133. The gate spacer 135 may include at least one of silicon nitride, silicon oxynitride, silicon dioxide, silicon oxynitride, or a combination of these. The gate spacer 135 is illustrated as a single layer. However, embodiments are not limited thereto. The gate spacer 135 may have a multi-layer structure.

A first high density impurity region 111 may be on both sides of the gate structure 130 on a top side portion of the first active region 110. The first high density impurity region 111 may form a source and a drain. When the first active region 110 and the first well region I are of a p-conductivity type, high density n+ type impurity may be injected via an ion injection process. Additionally, a second high density impurity region may be on both sides of the gate structure 130 on a top side portion of the second active region 120. The first high density impurity region 111 and the second high density impurity region may be of different conductivity types. Since the first and second dummy active regions 160 and 170 are separate from the gate structure 130, the first and second dummy active regions 160 and 170 may not include high density impurity regions on top side portions thereof. The first and second dummy active regions 160 and 170 may be horizontally separate from the first high density impurity region 111 and the second high density impurity region.

An intermediate insulating layer 181 may be provided on the first and second active regions 110 and 120, the first and second power regions 140 and 150, and the first and second dummy active regions 160 and 170. The intermediate insulating layer 181 may be substantially flat. The intermediate insulating layer 181 may be substantially on the same level as the gate structure 130. The intermediate insulating layer 181 may cover a side wall of the gate structure 130. The intermediate insulating layer 181 may include insulating materials such as silicon oxide, plasma enhanced oxide (PEOX), tetraethyl orthosilicate (TEOS), boro tetraethyl orthosilicate (BTEOS), phosphorous tetraethyl orthosilicate (PTEOS), boro phosphor tetraethyl orthosilicate (BPTEOS), boro silicate glass (BSG), phosphor silicate glass (PSG), and boro phosphor silicate glass (BPSG).

Contact plugs 180 may substantially be on the same level as the intermediate insulating layer 181. The contact plugs 180 may penetrate through the intermediate insulating layer 181 in the third direction (the z direction). The contact plugs 180 may be electrically connected to the first high density impurity region 111, the second high density impurity region, the first power region 140, and the second power region 150, respectively. The contact plugs 180 may contact portions of top side surfaces of the first high density impurity region 111, the second high density impurity region, the first power region 140, and the second power region 150. The voltage of the first and second well regions I and II may be maintained at a certain voltage via the contact plugs 180 on the first and the second power regions 140 and 150.

The contact plugs 180 may not be provided on the first and second dummy active regions 160 and 170. However, embodiments are not limited thereto. The first and second dummy active regions 160 and 170 may be horizontally separate from the contact plug 180. The first and second dummy active regions 160 and 170 may not overlap the contact plug 180, on a top view. Top side surfaces of the first and second dummy active regions 160 and 170 may be covered by the intermediate insulating layer 181. The contact plug 180 may include conductive materials such as aluminum and copper. However, embodiments are not limited thereto.

FIGS. 3 through 8 are enlarged layout diagrams of the region E in FIG. 2A of the semiconductor device 10 according to example embodiments.

Descriptions of content overlapping with content described above with reference to FIGS. 2A through 2E will be omitted and descriptions of differences will be mainly provided for the sake of convenience.

Figure 3:
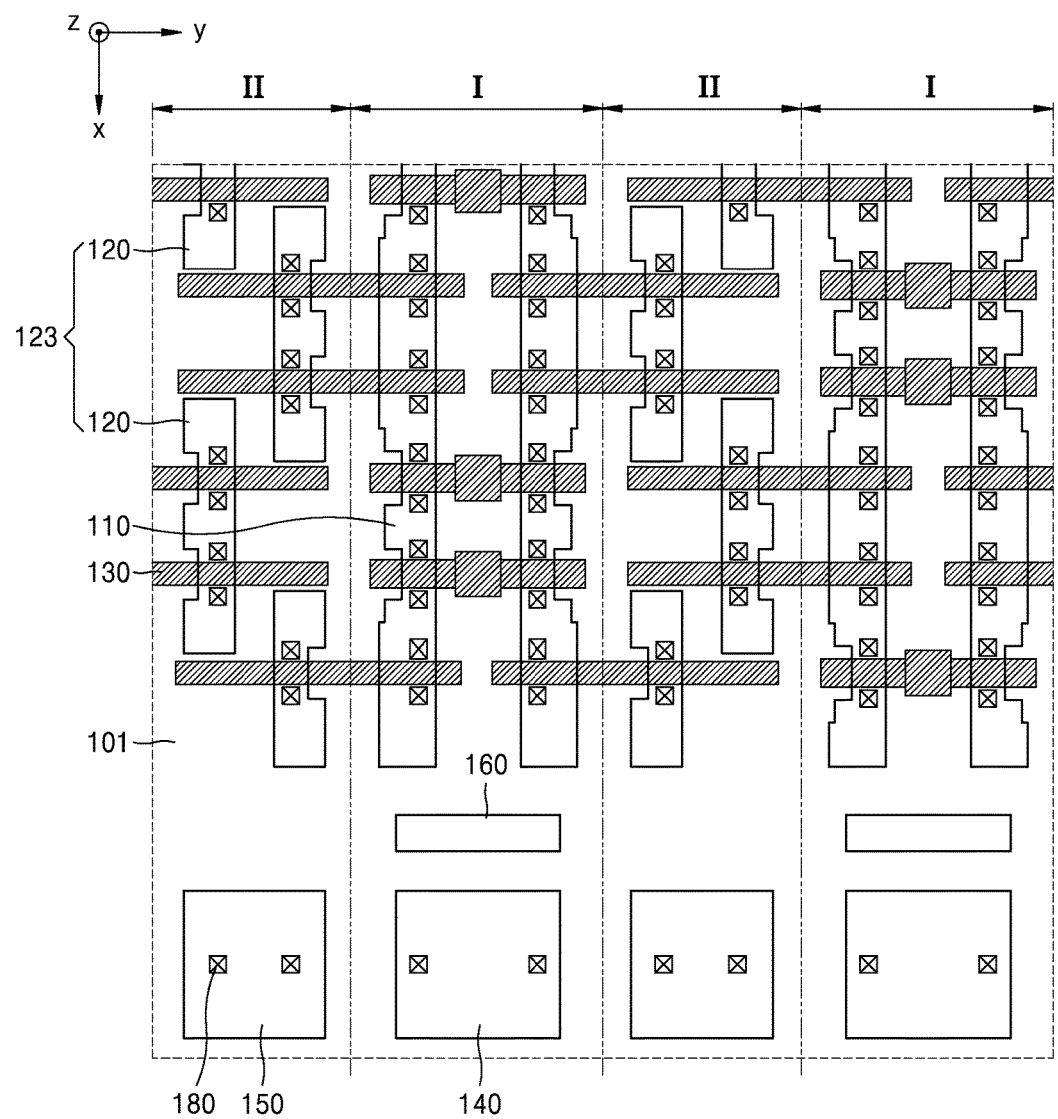
FIGS. 3 through 8 are layout diagrams of a semiconductor device according to example embodiments.

Referring to FIG. 3, the first dummy active regions 160 may be provided between the first active regions 110 and the first power regions 140. A dummy active region may be only between the first active region 110 and the first power region 140. Only the element separating layer 101 may be between the second active regions 120 and the second power regions 150. Dummy active regions may not be provided between the second active regions 120 and the second power regions 150.

According to an example embodiment, a sum of lengths of portions of the element separating layers 101 between the first active regions 110 and the first power regions 140 in the first direction (the x direction) may be less than that between the second active regions 120 and the second power regions 150 in the first direction (the x direction). A sum of a length of the element separating layer 101 between the first active region 110 and the first dummy active region 160 in the first direction (the x direction) and a length of the element separating layer 101 between the first power region 140 and the first dummy active region 160 in the first direction (the x direction) in a first well region I may be less than a length of the element separating layer 101 between the second power region 150 and the second active region 120 in the first direction (the x direction) in a second well region II.

Probability of defect occurrence may be higher in the first active regions 110, among the first and second active regions 110 and 120, which extends longer than the second active regions 120 in the first direction (the x direction). According to an example embodiment, defects may be prevented from occurring the first active region 110, and reliability and manufacturing yield may be improved by forming the first dummy active regions 160 between the first active regions 110 and the first power regions 140.

Figure 4A:
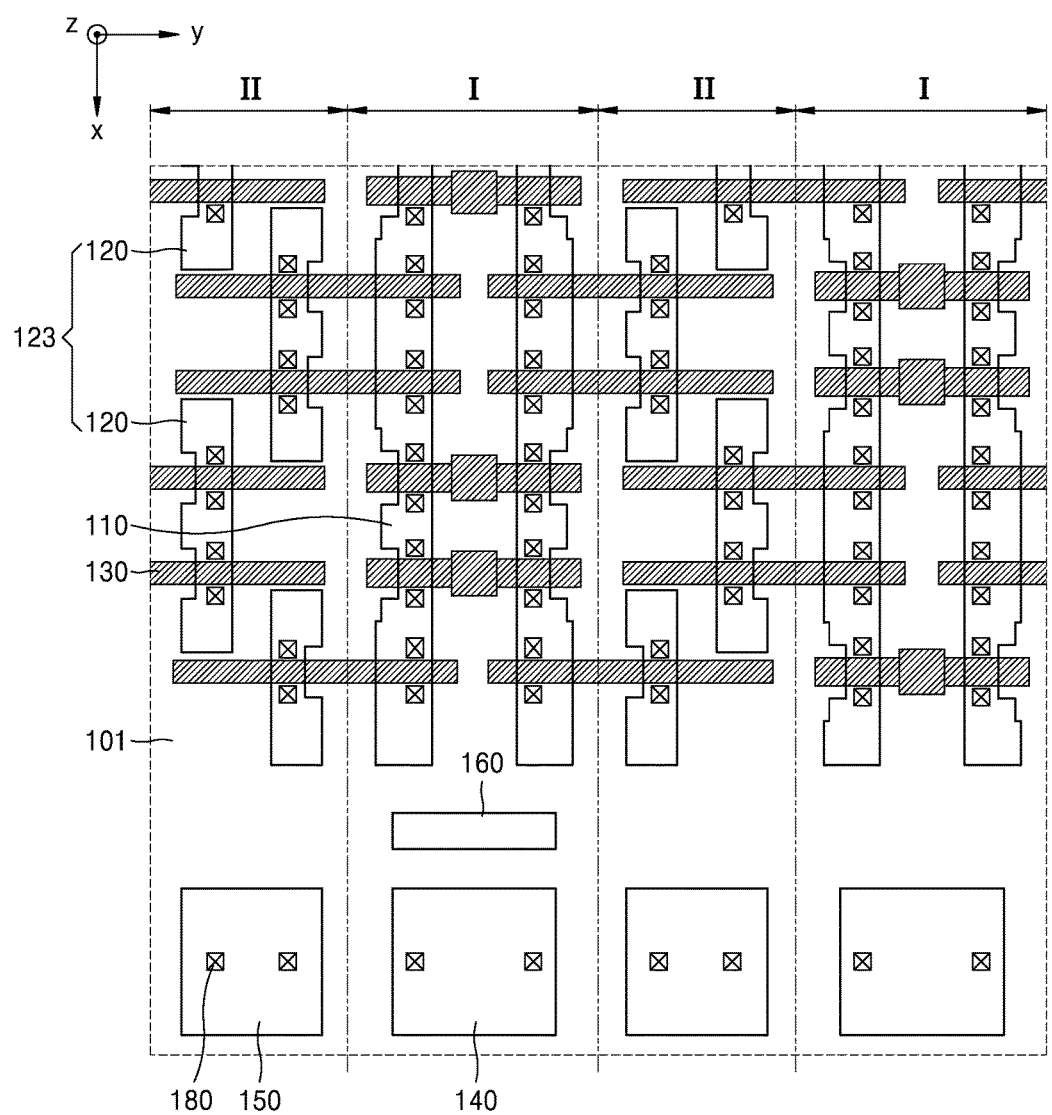

Referring to FIG. 4A, a first dummy active region 160 may be provided between the first active regions 110 and the first power region 140 in a first well region I. Only the element separating layer 101 may be provided between the first active regions 110 and the first power region 140 in other first well regions I, and between the second active region 120 and the second power region 150 in the second well regions II. Dummy active regions may not be provided between the other first active regions 110 and the other first power regions 140 in the other first well regions I, and between the second active regions 120 and the second power regions 150 in the second well regions II. That is, the first dummy active region 160 may be formed in only one of the first well regions I.

As described above, the first and second active regions 110 and 120 and the gate structure 130 may form a transistor. According to an example embodiment, the gate structure 130 closest to the first dummy active region 160 and a portion of the first active region 110 closest to the first dummy active region 160 may form the first pull-down transistor PD1 or the second pull-down transistor PD2 in FIG. 1.

Figure 4B:
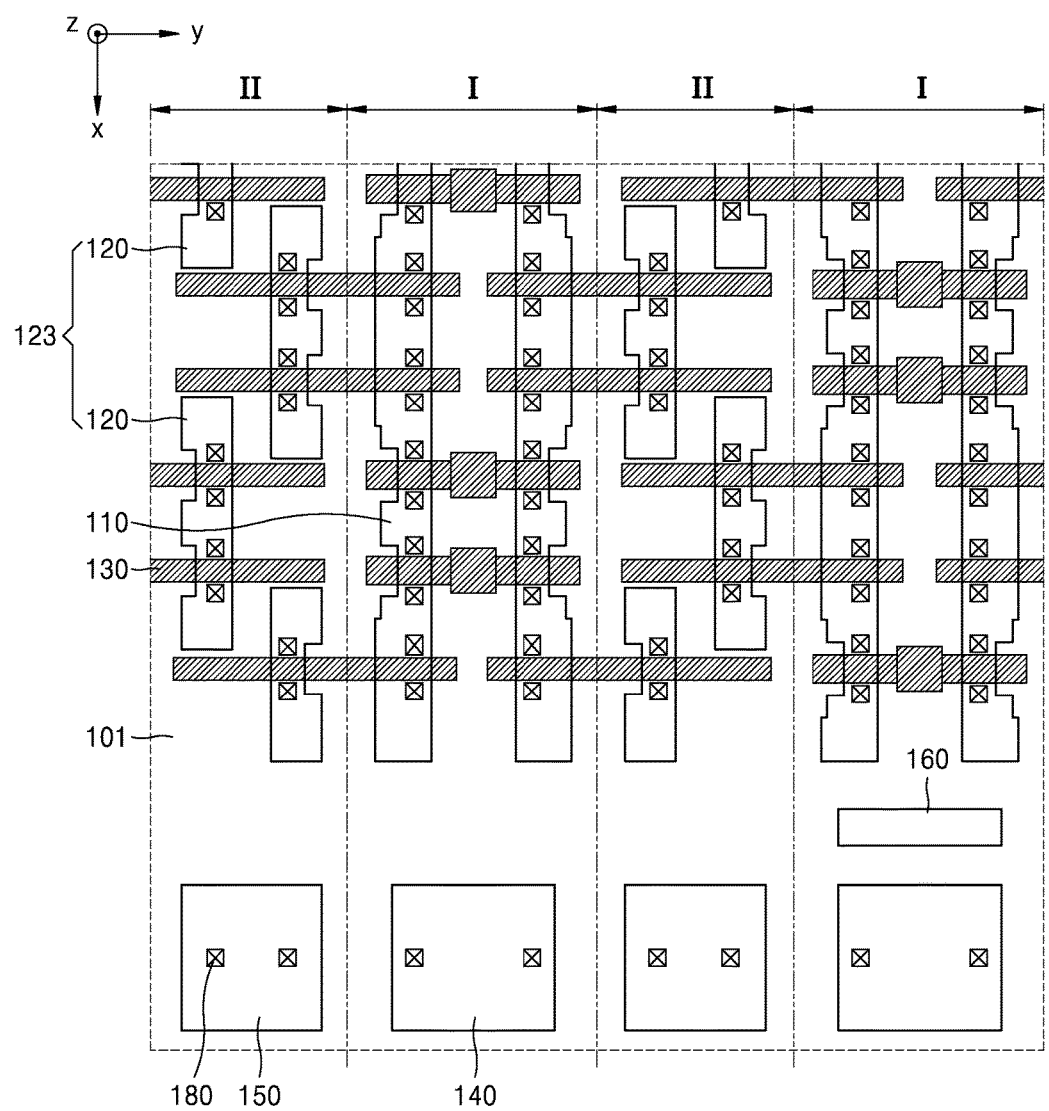

Referring to FIG. 4B, the gate structure 130 closest to the first dummy active region 160 and a portion of the first active region 110 closest to the first dummy active region 160 may form the first pass transistor PG1 or the second pass transistor PG2, unlike FIG. 4A. In the case of transistors corresponding to FIGS. 4A and 4B, a sum of pitches of the first and second active regions 110 and 120 may be substantially the same as a pitch of the first dummy active region 160.

Figure 5:
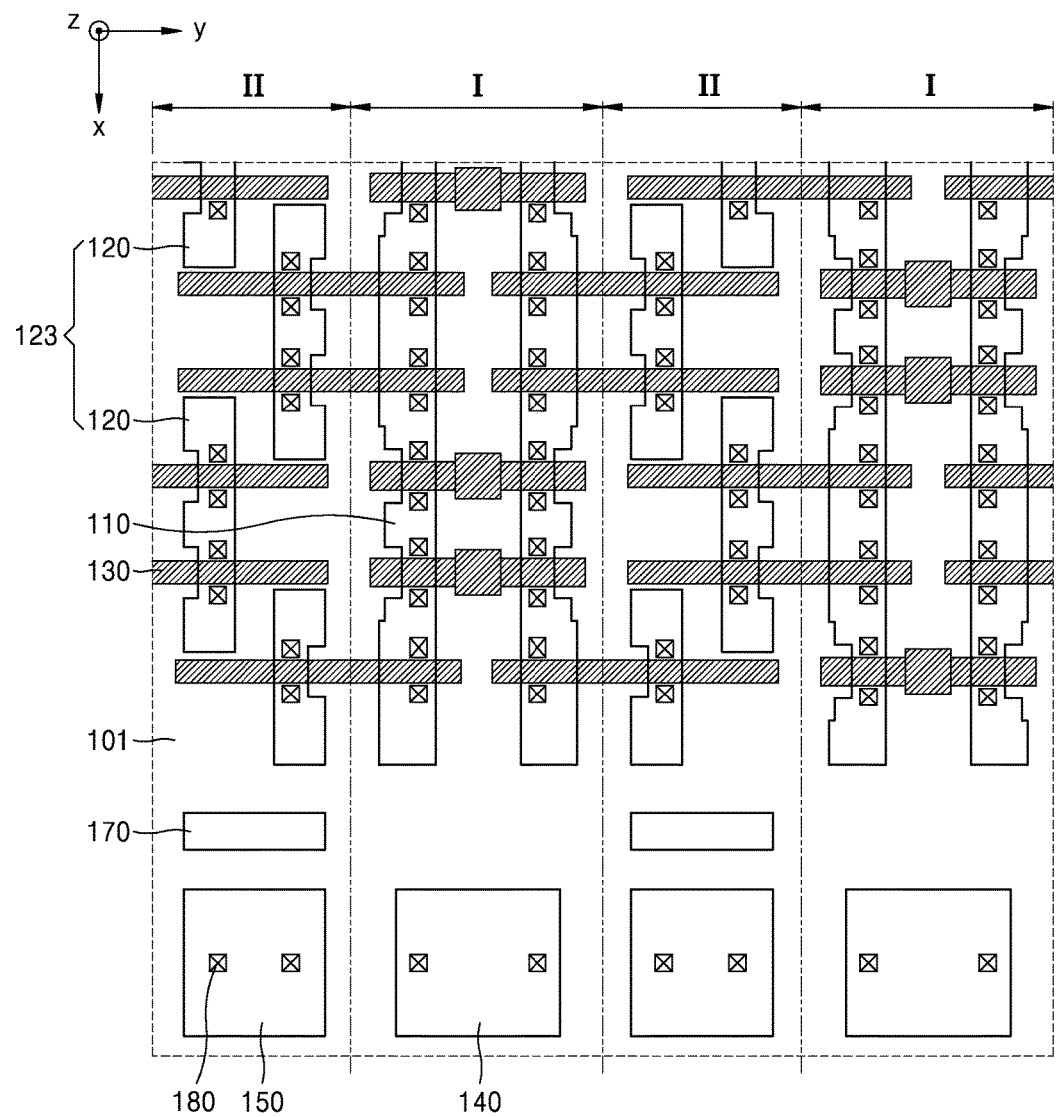

Referring to FIG. 5, the second dummy active region 170 may be between the second active region array 123 and the second power region 150. The second dummy active region 170 may be arranged only between the second active region array 123 and the second power region 150. Only the element separating layer 101 may be arranged between the first active region 110 and the first power region 140. A dummy active region may not be arranged between the first active region 110 and the first power region 140. A dummy active region may not be formed on the top side portion of the first well region I.

The length of a portion of the element separating layer 101 between the first active region 110 and the first power region 140 in the first direction (the x direction) may be greater than a sum of lengths of portions of the element separating layer 101 between the second active region 120 and the second power region 150 in the first direction (the x direction). The second dummy active region 170 may be formed on the top side portion of the second well region II.

According to an example embodiment, damage on the second active region 120 arranged at ending edges of the second active region array 123 in the first direction (the x direction) may be prevented by forming the second dummy active region 170 between the second active region array 123 and the second power region 150. Accordingly, reliability and yield of semiconductors may be improved. A sum of pitches of the first and the second active regions 110 and 120 may be substantially the same as the pitch of the second dummy active region 170.

Figure 6:
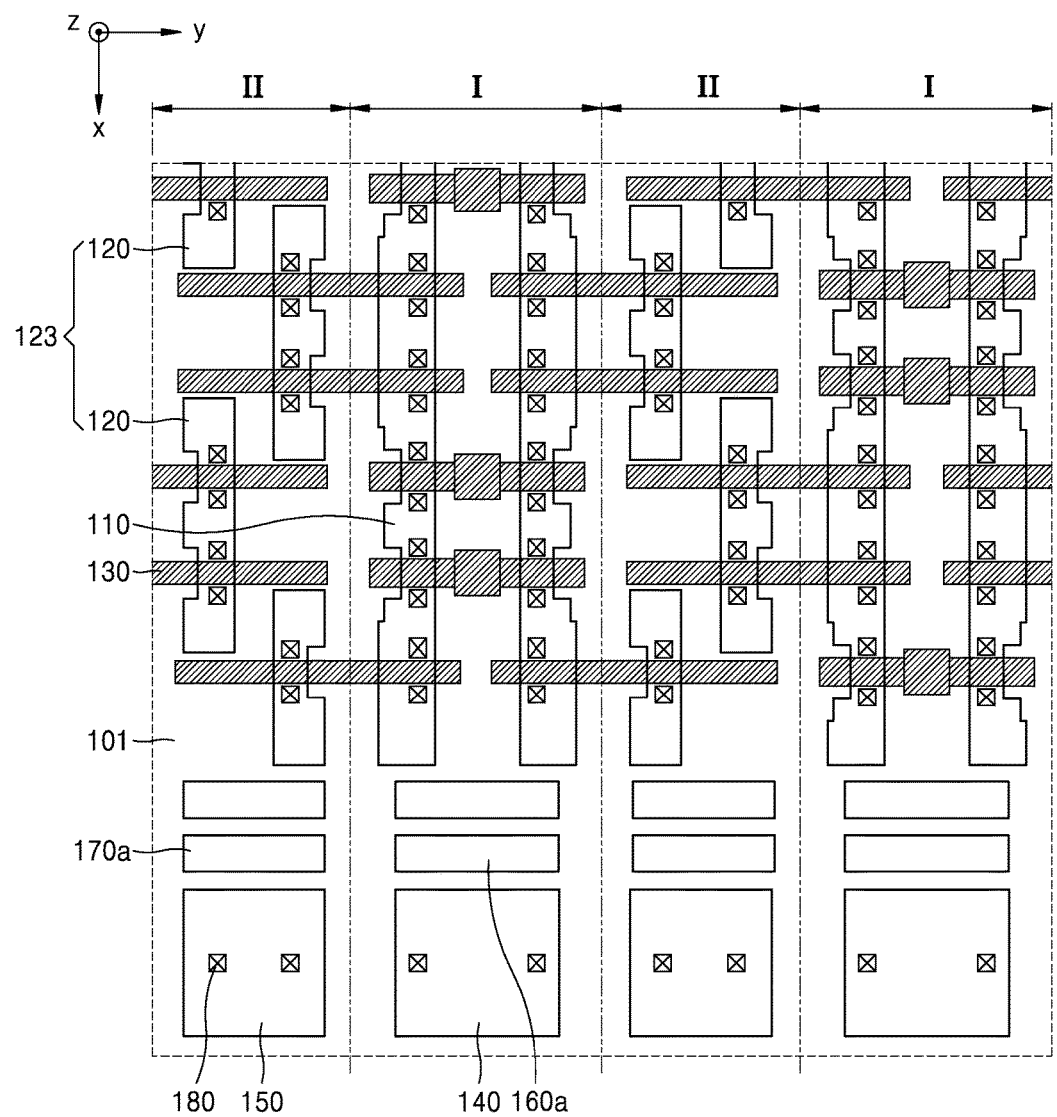

Referring to FIG. 6, a plurality of first dummy active regions 160a may be separate from and aligned with each other between the first active region 110 and the first power region 140 in the first direction (the x direction). A plurality of second dummy active regions 170a may be separate from and aligned with each other between the second active region 120 and the second power region 150 in the first direction (the x direction). Referring to FIG. 6, the first and second dummy active regions 160a and 170a are illustrated to have same sizes and same shapes. However, embodiments are not limited thereto. In addition, two of the first and second dummy active regions 160a and 170a may be between the first active region 110 and the first power region 140, and between the second active region 120 and the second power region 150, respectively. However, embodiments are not limited thereto.

Sizes of horizontal cross-sections of the first dummy active regions 160a at the same level in one of the first well region I may be different from each other. In addition, sizes of horizontal cross-sections of the second dummy active regions 170a at the same level in one of the second well region II may be different from each other. In addition, it is illustrated that two of the first dummy active regions 160a and two of the second dummy active regions 170a are sequentially arranged in each of the first and second well regions I and II, respectively. However, three or more of the first dummy active regions 160a and three or more of the second dummy active regions 170a may be separate from and aligned with each other in the first direction (the x direction).

Figure 7:
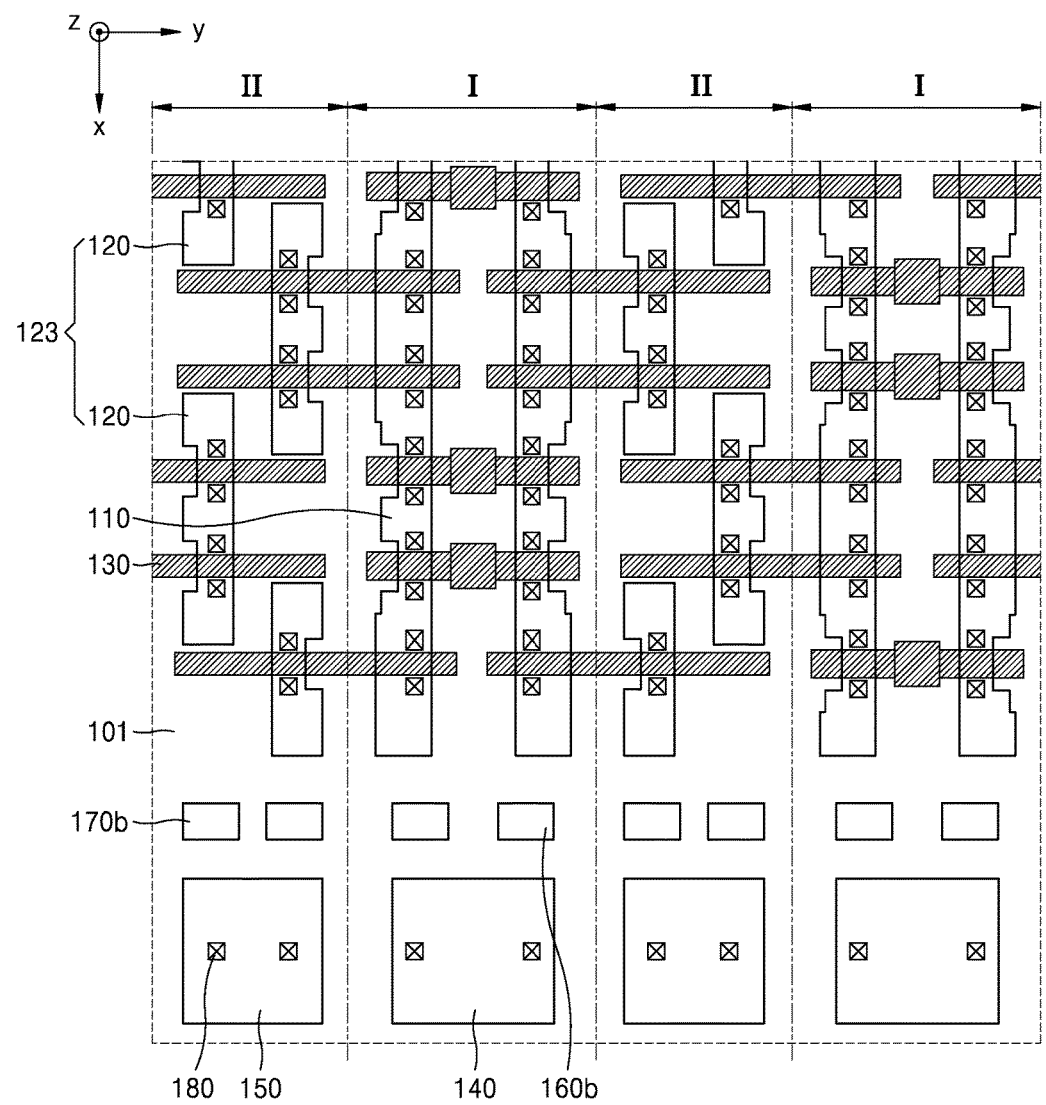

Referring to FIG. 7, a plurality of first dummy active regions 160b may be separate from and aligned with each other in one of the first well region I in the second direction (the y direction). Each of the first dummy active regions 160b may correspond to respective first active regions 110. For example, two of the first active regions 110 and two of the first dummy active regions 160b may be formed in one of the first well region I. However, embodiments are not limited thereto. Three or more of the first dummy active regions 160b may be separate from and aligned with each other in the second direction (the y direction).

A plurality of second dummy active regions 170b may be separate from and aligned with each other in one of the second well region II in the second direction (the y direction). Each of second dummy active regions 170b may correspond to respective second active region arrays 123. For example, two of the second active region arrays 123 and four of the second dummy active regions 170b may be formed in one of the second well regions II. However, embodiments are not limited thereto. Six or more of the second dummy active regions 170b may be separate from and aligned with each other in the second direction (the y direction).

Figure 8:
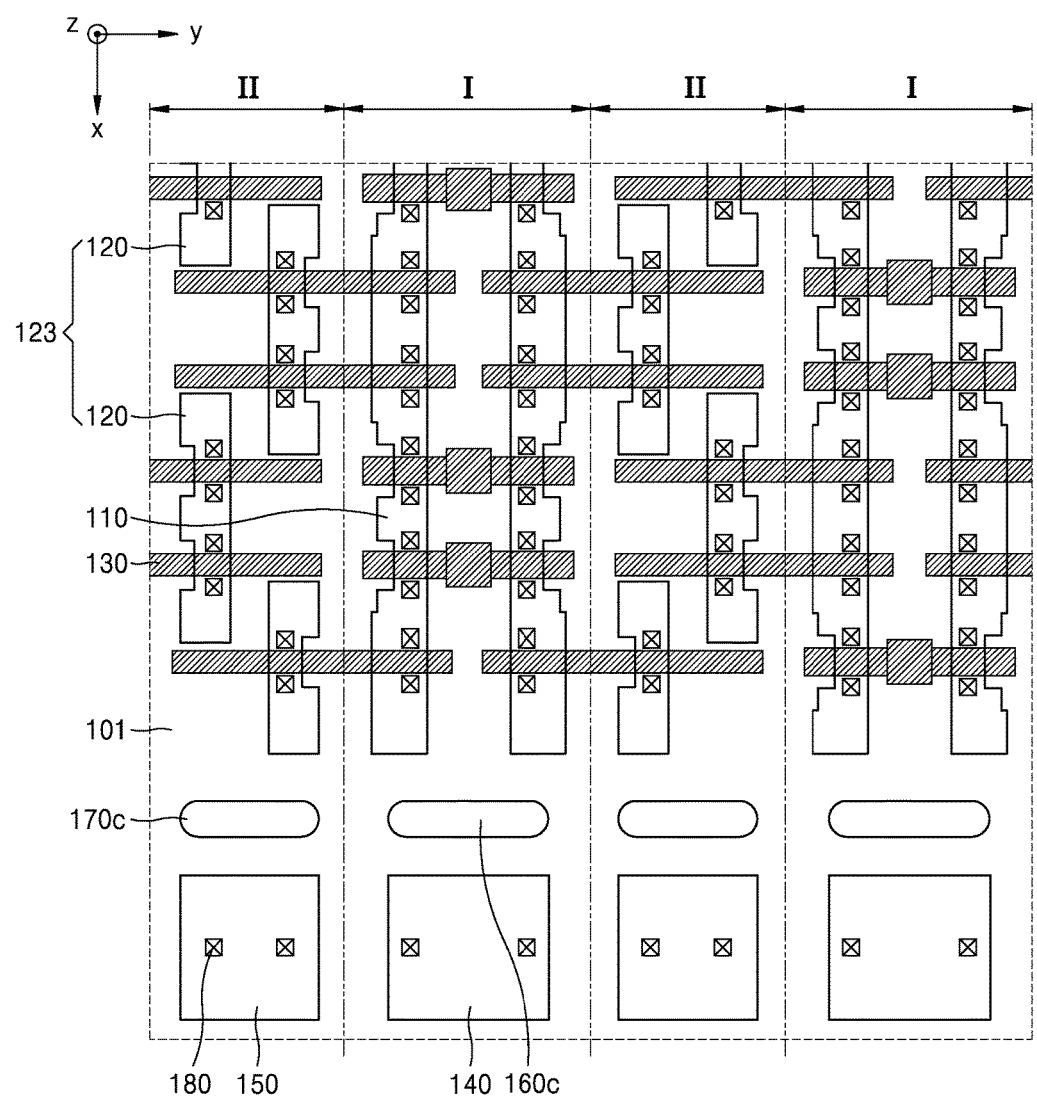

Referring to FIG. 8, first dummy active regions 160c and second dummy active regions 170c may extend in the second direction (the y direction) and may have linear shapes with rounded ending edges. However, embodiments are not limited thereto. In a top view, the first and second dummy active regions 160c and 170c may have various shapes such as a polygon, a circle, an ellipse, or a combination of these.

Figure 9:
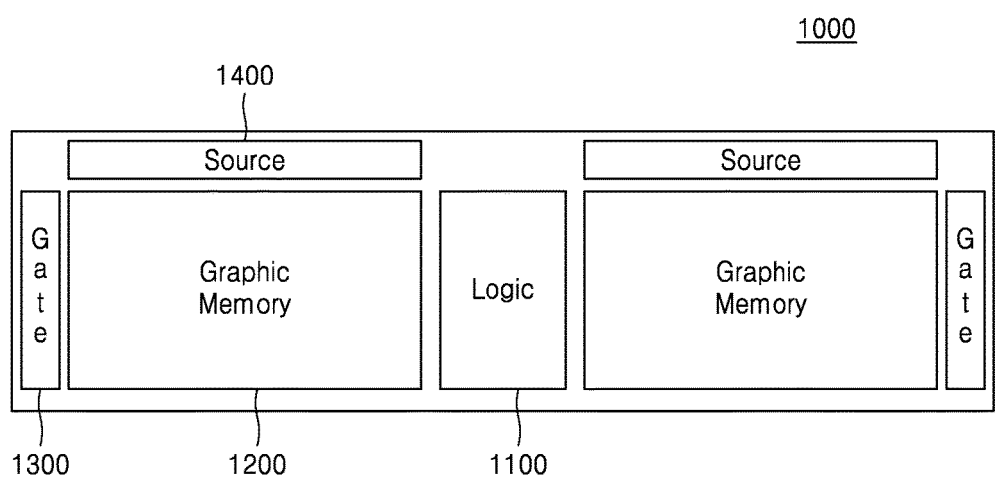
FIG. 9 is a block diagram of a display driving integrated circuit including a semiconductor device, according to an example embodiment.

FIG. 9 is a block diagram of a display driving integrated circuit (DDI) 1000 including a graphic memory 1200 including a semiconductor device, according to an example embodiment.

Referring to FIG. 9, the DDI 1000 may include a logic circuit 1100, a graphic memory 1200, a gate driving circuit 1300, and a source driving circuit 1400.

The DDI 1000 may be an element for driving displays in smart phones, TV sets, etc. According to an example embodiment, the DDI 1000 may be an element for presenting colors by controlling pixels of a display. The DDI 1000 may control on/off, luminance, etc. of pixels of the display. According to an example embodiment, the DDI 1000 may be provided as a chip on film attachable to a glass substrate, and in this case, the DDI may compose a flexible display.

The logic circuit 1100 may receive control signals such as RGB image signals, vertical synchronizing signals, horizontal synchronizing signals, main clock signals, and data enable signals. The logic circuit 1100 may generate source control signals and gate control signals based on control signals. The logic circuit 1100 may adequately adjust image signals to operating conditions of the liquid crystal panel (LCD). The logic circuit 1100 may transfer gate signals to the gate driving circuit 1300, and source control signals and image signals to the source driving circuit 1400.

The graphic memory 1200 may store graphic data received from the logic circuit 1100. The graphic memory 1200 may include semiconductor devices corresponding to FIGS. 2B and 3 through 8.

The gate driving circuit 1300 may include a plurality of integrated circuits for driving gates. The gate driving circuit 1300 may apply gate signals to gate lines arranged on the LCD. The gate driving circuit 1300 may generate gate signals as a combination of on-voltage (Von) and off-voltage (Voff).

The source driving circuit 1400 may apply source signals to source lines arranged on the LCD. The source driving circuit 1400 may execute a digital-to-analog transformation on data received from the data logic circuit 1100 and apply the transformed data to the source lines.

The LCD may include thin film transistors (TFTs), which are arranged in rows and columns and at intersections of a matrix accordingly formed. The source of the TFT may receive source signals (or denoted as 'data signals') and the gate of the TFT may receive gate signals (or denoted as 'scanning signals'). The LCD may receive the gate signals from the gate driving circuit 1300 and the source signals from the source driving circuit 1400.

According to an example embodiment, the DDI 1000 may include the source driving circuit 1400 having a driving condition at a high voltage, the gate driving circuit 1300 having a driving condition at an intermediate voltage, and the graphic memory 1200 and the logic circuit 1100 having a driving condition at a low voltage. The DDI 1000 may be manufactured in one process.

A well region drive-in process for manufacturing circuits satisfying characteristics of high pressure resistance may require a long high-temperature process. A thermal oxidation process for manufacturing silicon oxide circuits capable of operating at the intermediate voltage may also need the long high-temperature process. Semiconductors according to example embodiments may prevent damage on the active regions due to the high temperature process for a long time, by forming the dummy active regions. Thereby, the DDI 1000 may have highly improved yield and reliability.

While the inventive concept has been particularly shown and described with reference to example embodiments thereof, it will be understood that various changes in form and details may be made therein without departing from the spirit and scope of the following claims.

What is claimed is:

1. A semiconductor device comprising:
a substrate;
first well regions and second well regions formed in an upper portion of the substrate, the first well regions and the second well regions extending in a first direction and being alternately arranged in a second direction crossing the first direction;
first active regions formed in the first well regions;
first power regions formed in the first well regions, the first active regions and the first power regions being separate from each other and alternately arranged in the first direction;
second active region arrays formed in the second well regions;
second power regions formed in the second well regions, the second active region arrays and the second power regions being separate from each other and alternately arranged in the first direction; and
first dummy active regions formed in the first well regions between the first active regions and the first power regions, the first dummy active regions being separate from the first active regions and the first power regions in the first direction,
wherein a first conductivity type of the first well regions is different from a second conductivity type of the second well regions.

2. The semiconductor device of claim 1, further comprising an element separating layer formed in the first well regions and the second well regions, portions of the element separating layer being arranged between the first active regions and the first dummy active regions, between the first dummy active regions and the first power regions, and between the second active region arrays and the second power regions.

3. The semiconductor device of claim 2, wherein the second active region arrays comprises second active regions which are separate from and aligned with each other in the first direction, and
a first sum of lengths of portions of the element separating layer between the first active regions and the first power regions in the first direction is less than a second sum of lengths of portions of the element separating layer between the second active regions and the second power regions in the first direction.

4. The semiconductor device of claim 2, further comprising a plurality of gate structures arranged on the first active regions and the element separating layer, and extending in the second direction,
wherein an edge of an end portion of the first active regions adjacent to the first dummy active regions and a gate structure closest to the first dummy active regions, among the plurality of gate structures, form one of a pull-down transistor and a pass transistor.

5. The semiconductor device of claim 2, wherein only the element separating layer is arranged between the second power regions and the second active region arrays.

6. The semiconductor device of claim 1, wherein the second active region arrays comprises second active regions which are separate from and aligned with each other in the first direction, and a length of the first active regions in the first direction is longer than lengths of each of the second active regions in the first direction.

7. The semiconductor device of claim 1, wherein a first length of the first dummy active regions in the second direction is greater than a second length of the first active regions in the second direction.

8. The semiconductor device of claim 1, wherein a first average of distances between the first dummy active regions in adjacent first well regions is larger than a second average of distances between the first active regions in the adjacent first well regions.

9. The semiconductor device of claim 1, further comprising second dummy active regions provided between the second active region arrays and the second power regions, the second dummy active regions being separate from the second active region arrays and the second power regions in the second direction.

10. A semiconductor device comprising:

a substrate;

first well regions formed in an upper portion of the substrate;

second well regions formed in the upper portion of the substrate, the first well regions and the second well regions extending in a first direction and being adjacent to each other in a second direction crossing the first direction;

first active regions formed in the first well regions;

first power regions formed in the first well regions, the first active regions and the first power regions being separate from each other in the first direction;

second active region arrays formed in the second well regions;

second power regions formed in the second well regions, the second active region arrays and the second power regions being separate from each other in the first direction; and second dummy active regions formed between the second active region arrays and the second power regions in the second well regions, the second dummy active regions being separate from the second active region arrays and the second power regions in the first direction, wherein the second active region arrays comprises a plurality of second active regions which are separate from and aligned with each other in the first direction, and wherein a first conductivity type of the first well regions is different from a second conductivity type of the second well regions.

11. The semiconductor device of claim 10, further comprising an element separating layer formed in the first well regions and the second well regions, portions of the element separating layer being arranged between the second active region arrays and the second dummy active regions, between the second dummy active regions and the second power regions, and between the first active regions and the first power regions.

12. The semiconductor device of claim 11, wherein a first length of the second dummy active regions in the second direction is greater than a second length of each of the second active region arrays in the second direction.

13. The semiconductor device of claim 11, wherein only the element separating layer is arranged between the first power regions and the first active regions.

14. The semiconductor device of claim 11, wherein a first length of each of the second active region arrays in the first direction is greater than a second length of the second dummy active regions in the second direction.

* * * * *